(12) United States Patent
Ozden

(10) Patent No.: US 7,884,685 B2
(45) Date of Patent: Feb. 8, 2011

(54) BAND SWITCHING BY DIPLEXER COMPONENT TUNING

(75) Inventor: Sinasi Ozden, Søborg (DK)

(73) Assignee: Nokia Corporation, Espoo (FI)

( * ) Notice: Subject to any disclaimer, the term of this patent is extended or adjusted under 35 U.S.C. 154(b) by 13 days.

(21) Appl. No.: 11/899,339

(22) Filed: Sep. 5, 2007

(65) Prior Publication Data

US 2009/0058554 A1 Mar. 5, 2009

(51) Int. Cl.
*H03H 7/46* (2006.01)

(52) U.S. Cl. .................. 333/132; 333/126; 333/129; 333/174

(58) Field of Classification Search .............. 333/126, 333/129, 132, 173–176
See application file for complete search history.

(56) References Cited

U.S. PATENT DOCUMENTS

| | | | |
|---|---|---|---|
| 6,229,495 B1 | 5/2001 | Lopez et al. ............ 343/791 |
| 6,414,566 B1 * | 7/2002 | Atokawa ............... 333/134 |
| 6,525,624 B1 * | 2/2003 | Hikita et al. ........... 333/133 |
| 6,653,912 B2 * | 11/2003 | Robinson et al. ....... 333/132 |
| 6,950,410 B1 * | 9/2005 | Brandt ................... 370/276 |
| 7,038,557 B2 * | 5/2006 | Nakamura et al. ...... 333/132 |
| 2005/0181847 A1 | 8/2005 | Boyle .................... 455/575.7 |

OTHER PUBLICATIONS

A Novel Dual-Fed, Self-Diplexing PIFA and RF Front-End, K.R. Boyle et al, Wireless Group, Philips Research Laboratories, Redhill, England, Jun. 2004.
Multi-band Antennas with Integrated Circuitry in Mobile Phones, L.P. Ligthart, Delft University of Technology, Leat Sophia Antipolis, Jun. 2005.

* cited by examiner

*Primary Examiner*—Robert Pascal
*Assistant Examiner*—Kimberly E Glenn
(74) *Attorney, Agent, or Firm*—Harrington & Smith (57) ABSTRACT

A circuit and antenna arrangement includes a diplexer having a single radio frequency input/output interface and dual feed connections with an antenna adapted for use over a plurality of frequency bands. The diplexer has a capacitance connected between the radio frequency input/output interface and the antenna, and further has an additional capacitance that is selectively one of connected or not connected in parallel with the capacitance. In one embodiment the additional capacitance may be a capacitor in series with a switch, while in another embodiment the additional capacitance may be a MEMS variable capacitor.

29 Claims, 8 Drawing Sheets

| SYSTEM | FREQUENCY |
|---|---|
| GSM850 | 824-849/869-894 |
| GSM900 | 880-915/925-960 |
| GSM1800 | 1710-1785/1805-1880 |
| GSM1900 | 1850-1910/1930-1990 |
| UMTSI | 1920-1980/2110-2170 |
| UMTSII | 1850-1910/1930-1990 |
| UMTSIII | 1710-1785/1805-1880 |
| UMTSIV | 1710-1755/2110-2155 |
| UMTSV | 824-849/869-894 |
| UMTSVI | 830-840/875-885 |
| UMTSVII | 2500-2570/2620-2690 |
| UMTSVIII | 880-915/925-960 |
| UMTSIX | 1750-1785/1845-1880 |

| m55 | m60 |
|---|---|
| freq=1.710GHz | freq=1.712GHz |
| S(1,1)=0.678/173.801 | S(2,2)=0.419/−149.086 |
| IMPEDANCE=Z0*(0.192+j0.052) | IMPEDANCE=Z0*(0.435−j0.227) |

BAND SWITCHING BY DIPLEXER COMPONENT TUNING

TECHNICAL FIELD

The exemplary embodiments of this invention relate generally to radio frequency antennas, transmitters, receivers and related components, including diplexers and, more specifically, relate to radio frequency circuitry intended to operate in two or more frequency bands (multi-band).

BACKGROUND

Various abbreviations that may appear in the description and drawings are defined as follows:
BW bandwidth
ESD electrostatic discharge
FEM front-end module
GSM global system for mobile communications
HB higher band
LB lower band
MEMS microelectromechanical system
S-parameters scattering parameters
S11 input reflection coefficient of 50 Ohm terminated output
S22 output reflection coefficient of 50 Ohm terminated input
SPDT single pole, double throw
UMTS universal mobile telecommunications system
WCDMA wideband code division multiple access Physically small antennas are a necessity for modern portable electronic devices, including communications devices such as mobile phones. However, as the size of the antenna is reduced it becomes more challenging to provide operation over a bandwidth that includes two or more frequency bands of interest. In general, decreasing the size of the antenna reduces the bandwidth, which in turn decreases the number of possible operating frequency bands. For example, in order to accommodate with one antenna the operating frequency bands in both the European and US cellular frequencies the antenna and related circuitry needs to have wide bandwidth properties.

Conventionally the use of matching components and/or tuning by switching in and out additional ground connections has enabled an increase in the antenna bandwidth. However, as the antenna size is decreased below a certain level the use of these conventional approaches is no longer adequate to achieve the desired bandwidth.

Representative conventional approaches to radio frequency antenna and related circuitry design include US 2005/0181847, "Wireless Terminals", Kevin R. Boyle, that describes a wireless terminal having a dual band antenna arrangement that comprises a planar inverted-F antenna having a first feed for signals in a first, lower frequency band, for example the GSM band, a second feed for signals in a second, higher frequency band, for example the DCS band, and a ground pin. In operation when transmitting in one of the bands, first and second PIN diodes of a relevant coupling stage are switched-on, while the PIN diodes in the other coupling stage are off, and when in a receiving mode all the PIN diodes are off. The signal being received by one of the transceivers is reflected by a band pass filter in the coupling stage of the other transceiver.

In U.S. Pat. No. 6,229,495 B1, "Dual-Point-Feed Broadband Whip Antenna", Alfred R. Lopez et al. describes a dual-radiator whip antenna to operate over a 30 to 450 MHz frequency band, and that includes a high frequency dipole above a low frequency monopole. An outer conductor of a coaxial line is configured to operate as a monopole. Above the upper terminus of the outer conductor, an extension of the inner conductor is configured as the upper arm of a dipole. An upper length of the outer conductor also functions as the lower dipole arm. With a single antenna port, a diplexer and other feed elements separate signals into high and low frequency bands respectively coupled to the dipole and monopole radiators. An increased high frequency range is said to result from positioning of the center of radiation of the dipole above the monopole.

Also of interest to multi-band antenna design principles is "Multi-Band Antennas with Integrated Circuitry in Mobile Phones", L. P. Ligthart, IRCTR-Delft University, LEAT Sophia Antipolis, June 2005, as well as "A Novel Dual-fed, Self-Diplexing PIFA and RF Front-end (PIN-DF$^2$-PIFA)", K. R. Boyle, M. Udink, A. de Graauw and L. P. Ligthart, Antennas and Propagation Society International Symposium, 2004, IEEE, Volume 2, 20-25 Jun. 2004, pages 1935-1938.

A diplexer is basically a device that enables two radio transmitters to use the same antenna. Existing diplexer designs fail to provide a desired wide bandwidth operation with a small antenna radiator.

SUMMARY

The foregoing and other problems are overcome, and other advantages are realized, in accordance with the exemplary embodiments of this invention.

In a first aspect thereof the exemplary embodiments provide a circuit arrangement that comprises a diplexer having a single radio frequency input/output interface and dual feed connections with an antenna adapted for use over a plurality of frequency bands. The diplexer comprises a capacitance connected between the radio frequency input/output interface and the antenna, and further comprises an additional capacitance that is selectively one of connected or not connected in parallel with the capacitance.

In another aspect thereof the exemplary embodiments provide an antenna arrangement comprising an antenna and a diplexer circuit, where the antenna comprises dual RF feeds and which generates at least two discrete resonant frequencies, and where the diplexer circuit is controlled to generate at least two additional discrete resonant frequencies of the antenna arrangement.

In another aspect thereof the exemplary embodiments provide a method that includes providing a diplexer having a single radio frequency input/output interface and dual feed connections with an antenna adapted for use over a plurality of frequency bands within a bandwidth; and applying a signal to the diplexer to change a value of a capacitance for shifting antenna resonances to operate over a wider bandwidth.

In a still further aspect thereof the exemplary embodiments of this invention provide a radio frequency antenna coupling means comprised of a single radio frequency input/output interface and dual feed connections with an antenna that is adapted for use over a plurality of frequency bands. The radio frequency antenna coupling means further comprises a first capacitance connected between said radio frequency input/output interface and the antenna, and further comprises means for selectively increasing or not increasing a value of the first capacitance.

BRIEF DESCRIPTION OF THE DRAWINGS

The foregoing and other aspects of the presently preferred embodiments of this invention are made more evident in the following Detailed Description of the Preferred Embodiments, when read in conjunction with the attached Drawing Figures, wherein.

DETAILED DESCRIPTION

The use of the exemplary embodiments of this invention enables one to provide a small antenna for a mobile device through the use of a diplexer having a switching circuit component. The antenna used may be a diplexed LB and HB antenna. The antenna may be used with single feed FEM-types of circuitry, although it is not limited to only this particular type of construction.

The exemplary embodiments of this invention provide a shiftable capacitance technique for diplexed antennas covering, as non-limiting examples, LB (824 MHz-960 MHz) and HB (1710 MHz-2170 MHz).

The exemplary embodiments of this invention are particularly well suited for use with small multi-band antennas fed by a single-feed engine. This means that the engine (or radio transceiver) combines all radio bands together and sends them to the antenna via a single connection, instead of having separate connections for each radio band. The diplexer then may be considered to be reversed, that is, in conventional usage the diplexer typically has a single feed to the antenna and multiple feeds to split the frequencies received on the antenna to plural different radio circuits. In the exemplary embodiments of this invention the diplexer operates with the LB and the HB at the dual-fed antenna. By switching the diplexer one obtains additional band coverage (or, resonances) which further increases the capability of the antenna for a particular volume.

As will be described in detail below, a shunt capacitance is selectively added to the diplexer using a switch (or some other equivalent approach) to switch the shunt capacitance in and out of the circuit as required by radio control software. This then shifts the two resonances created by the dual-antenna (separate LB & HB resonators) so that further band coverage is obtained.

Advantages that can be realized by the use of the exemplary embodiments of this invention include an ability to increase the number of bands for a given antenna volume. As a non-limiting example, one may cover the GSM850, 900, 1800, 1900 bands. Additionally UMTS bands I, II, IV are also covered.

Figure 1:
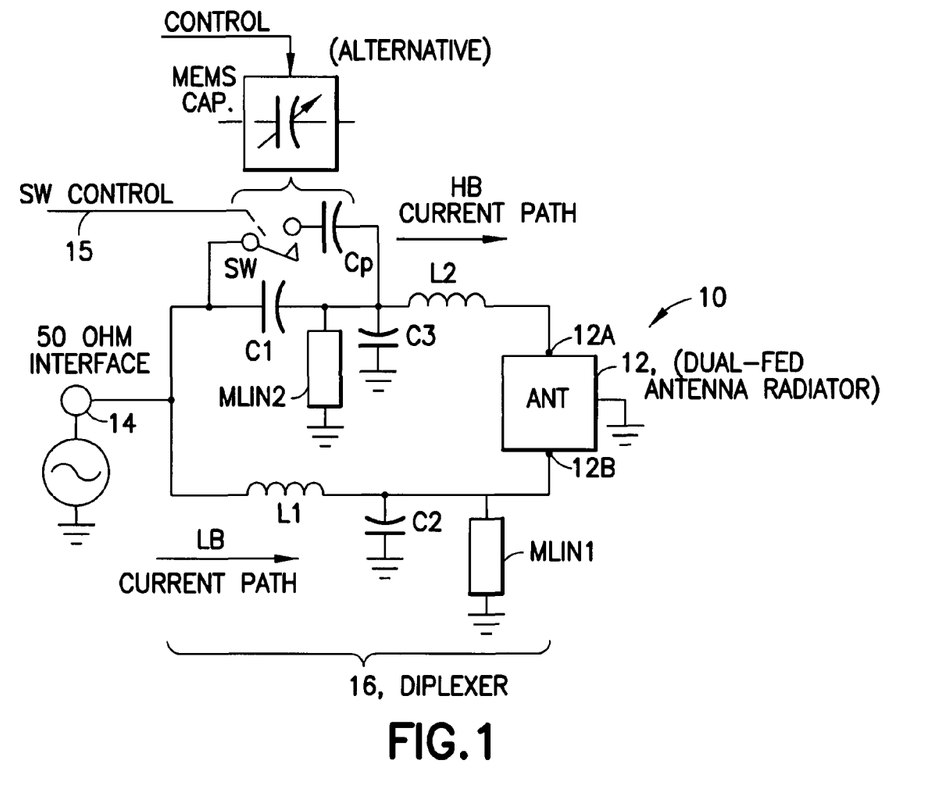
FIG. 1 is a schematic diagram of a diplexer and antenna assembly in accordance with an exemplary embodiment of this invention, where the diplexer includes a capacitor that can be selectively added in parallel with a diplexer input capacitance using a SPDT switch.
Figure 2:
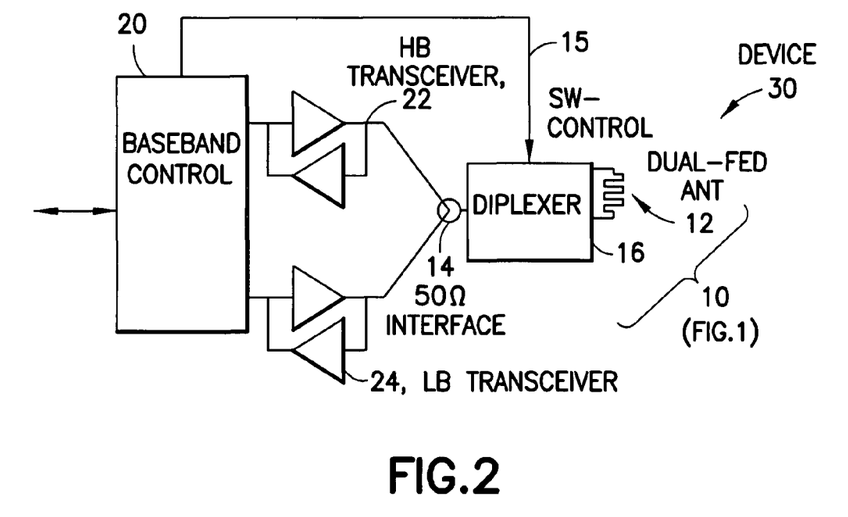
FIG. 2 is a block diagram of a mobile device that includes HB and LB transceivers connected with the diplexer and antenna assembly of FIG. 1.

FIG. 1 is a schematic diagram of a diplexer 16 and antenna 12 assembly 10 in accordance with an exemplary embodiment of this invention, where diplexer 16 includes a capacitor (Cp) that can be selectively added in parallel with a diplexer capacitance C1 using a SPDT switch (SW). The state of the SW (open/closed) is controlled by an input switch control signal (SW_Control) sourced by radio control software. The assembly 10 has a single input/output embodied as a 50 Ohm interface to RF circuitry. This RF circuitry is shown in FIG. 2 as logically including a HB transceiver 22 and LB transceiver 24. However, it should be appreciated that a single wideband transceiver may be used instead.

In addition to C1 the diplexer 16 includes an inductance L1, a second inductance L2 in series with C1, additional capacitances C2 and C3 connected to RF ground, and striplines MLIN1 and MLIN 2 (both connected to ground). Both MLIN1 and MLIN2 function to provide ESD protection, as they present a low impedance at lower frequencies. Representative and non-limiting values for these components, assuming that they are used with the frequencies (MHz) shown in FIG. 3, may be:

CP=0.7 pF
C1=1.8 pF
C2=10 pF
C3=5.1 pF
L1=5.6 nH
L2=2.2 nH

The series capacitor C1 and series inductor L1 filter the HB and LB current creating a separated current path from the 50 Ohm interface 14 to separate HB and LB patches of the antenna 12. C1 and L1 actually form the diplexer per se, while the remaining parallel components which are grounded, such as capacitors and microstrip lines (MLIN1, MLIN2), function as a parallel resonant circuit. In this example MLIN1 has a length of about 8 mm and a width of about 1 mm, and represents an inductance, and MLIN2 has a length of about 4 mm and a width of about 1 mm, and also represents an inductance.

The antenna 12 is a dual-fed antenna arrangement (with feeds 12A, 12B). The ability to switch the diplexer 16 connected between the dual-fed antenna 12 and the single-feed multi-band transceiver achieves a shiftable multi-resonance providing a capability to cover further transmit/receive protocols (frequency bands). The dual-fed antenna radiator may be constructed with a flex film on a plastic substrate, and may be a monopole type of antenna. As was noted, the antenna 12 in FIG. 1 represents two antenna patches, one for the high band and one for the low band.

It is preferable to locate the SW at or near to the 50 Ohm interface 14 to reduce losses. More specifically, the SW is placed at a location where the value of Q is of less significance, meaning that there is a reduced probability of harmonic generation caused by the presence of the SW.

In accordance with the exemplary embodiments the shunt capacitance Cp is added to the diplexer capacitor component C1 which enables frequency switching for cellular and other types of antennas. The shunt capacitance Cp is switched in and out of the diplexer circuitry the SPDT SW. Note that since Cp is placed in parallel with the diplexer capacitor C1 the presence of the SW introduces only small losses.

In another embodiment the SPDT SW can be eliminated if Cp is embodied as a MEMS variable capacitor controlled directly by an electrical signal input (shown as Control in FIG. 1). In this case the capacitance can be controlled over a range of values, as opposed to being completely switched out.

The specific diplexer 16 arrangement thus includes the shunt capacitor Cp which, due to being in parallel with one of the diplexer capacitors (C1 in this example), can be switched in (effectively adding capacitance due to parallel capacitance) or switched out of the diplexer circuit. This switching effectively shifts the antenna resonances to cover additional bands or protocols.

Figure 4:
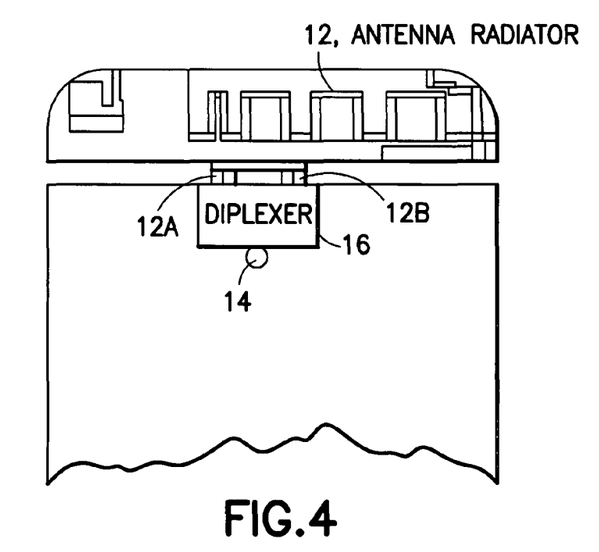
FIG. 4 is a top view of a portion of a mobile device chassis showing a non-limiting embodiment of the antenna.

Matching circuitry and the SW may be placed on a main printed wiring board, and the antenna 12 radiator on a separate support substrate, as shown in FIG. 4. The band switching arrangement in accordance with the exemplary embodiments of this invention enables the use of a smaller clearance area for off-ground types of antennas (also known as "planar antennas").

Figure 3:
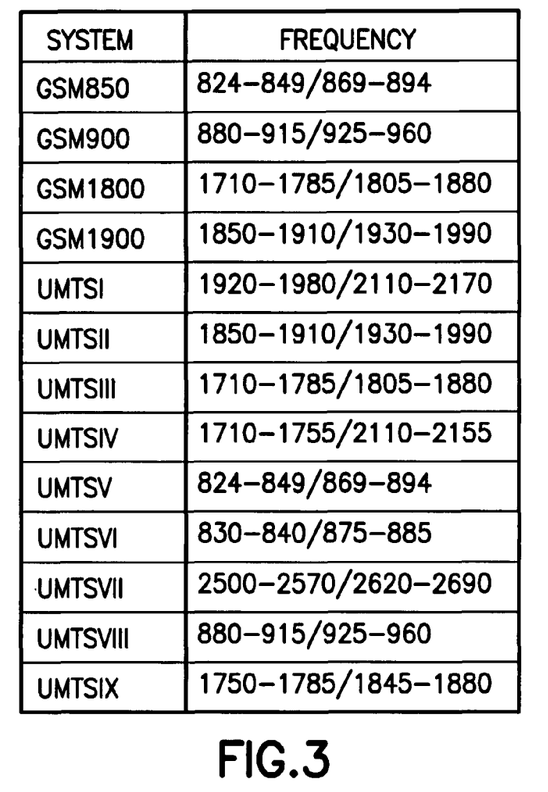
FIG. 3 is a table listing a number of UMTS bands that it may be desired to accommodate with the diplexer and antenna assembly shown in FIGS. 1 and 2.

As shown in FIG. 3, the SW is controlled by the signal line SW_Control sourced from control circuitry, such as from a baseband control unit 20 that forms part of a wireless device 30, such as a multi-band cellular phone. Also included are the HB transceiver 22 and the LB transceiver 24. Band switching may occur while the device 30 is in an active mode or in a call mode.

The physical size of the antenna 12 can be decreased considerably by using the switchable shunt capacitance Cp. The antenna 12 may be a small form factor patch-type antenna, and multi-radio band antenna setup may employ multiple cellular and non-cellular protocols.

The example embodiments of this invention accommodate, as non-limiting examples, GSM850, 900, 1800, 1900 bands, as well as at least UMTS bands I, II, IV.

Figure 7:
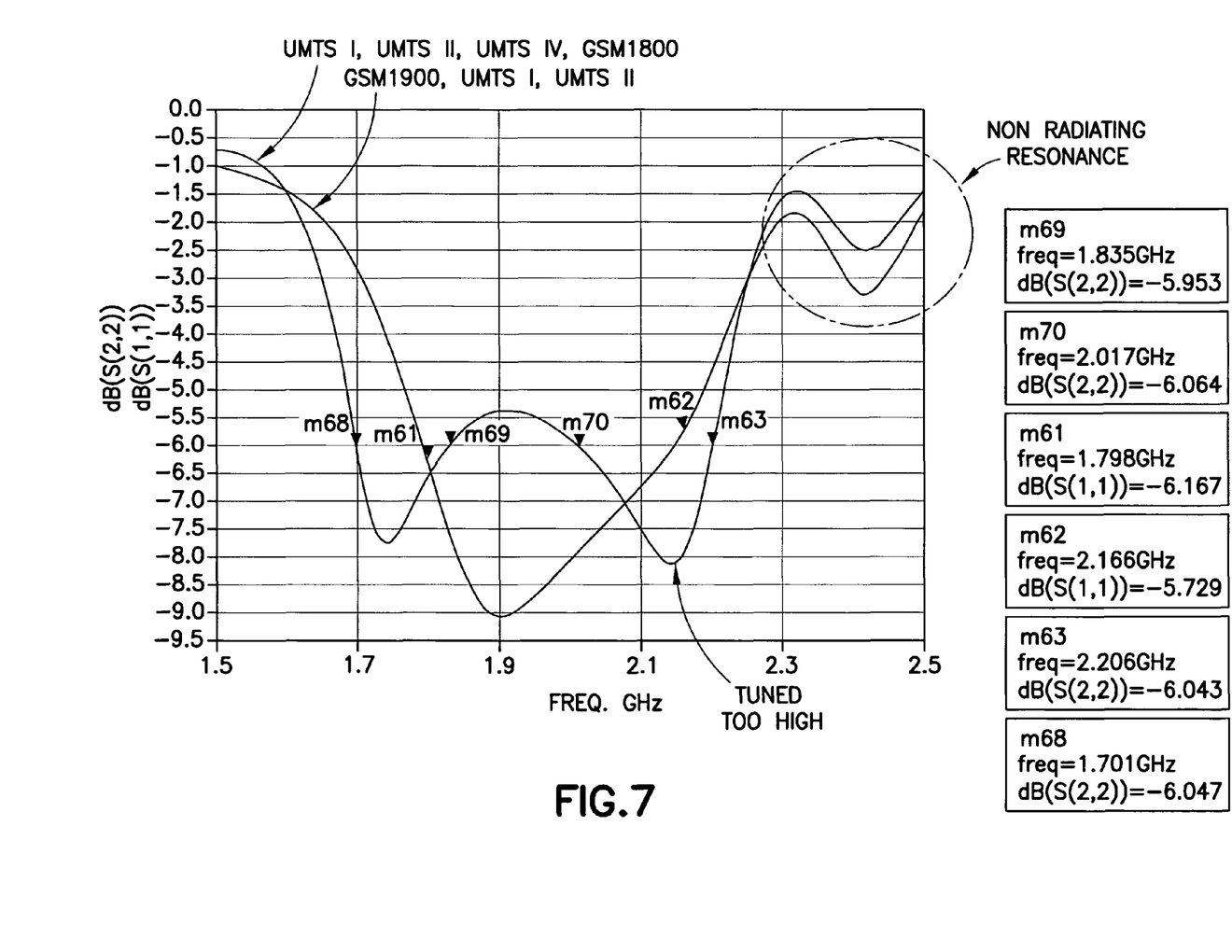
FIG. 7 shows a graph descriptive of losses in two frequency bands.

A non-radiating resonance is preferably tuned further away from the operating band in order to ensure that there is no impact on operating frequencies at HB (see FIG. 7).

Figure 5:
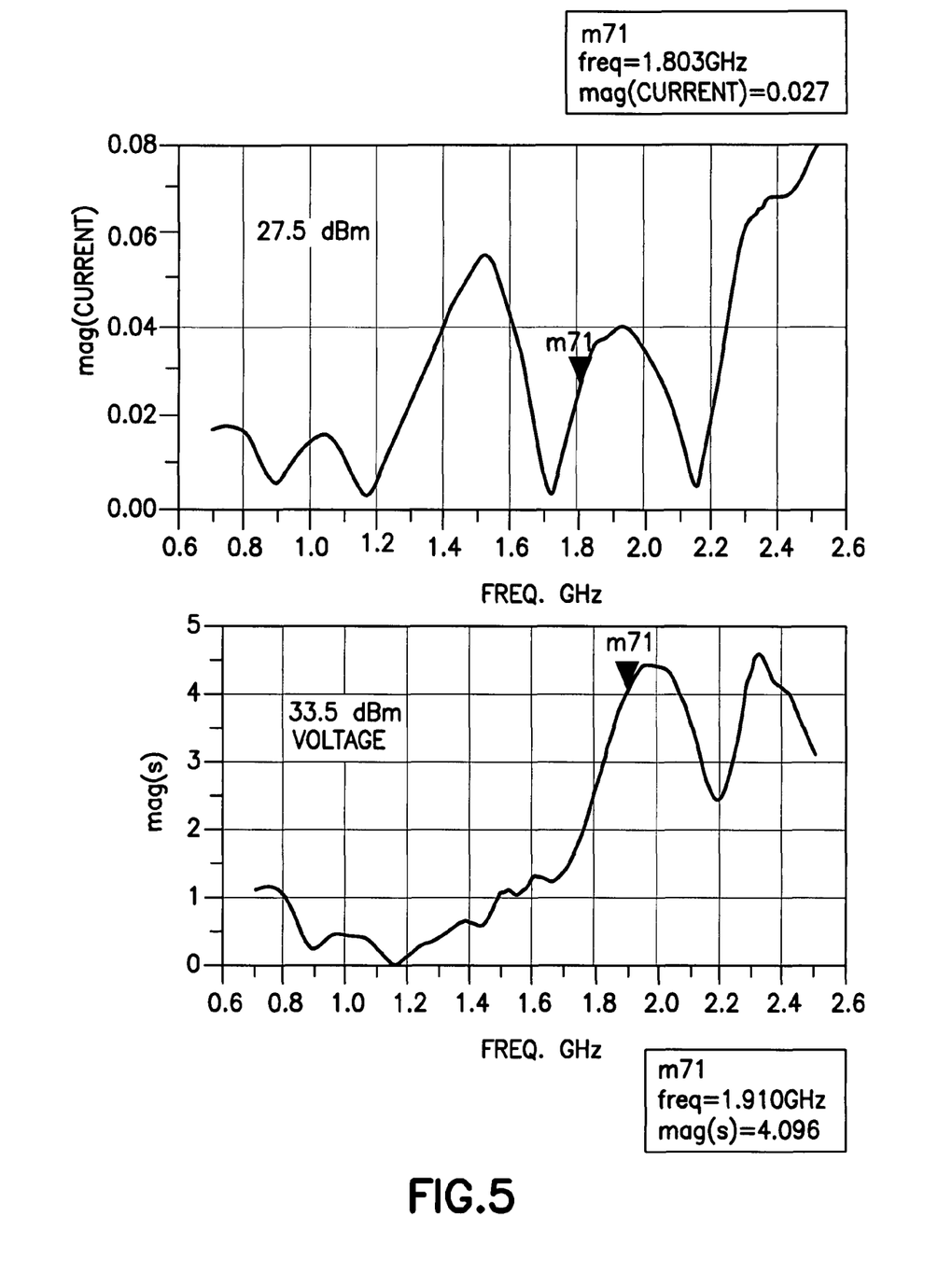
FIG. 5 depicts graphs descriptive of derating for the SPDT switch shown in FIG. 1, and the current and SPDT switch and voltage swing.
Figure 6:
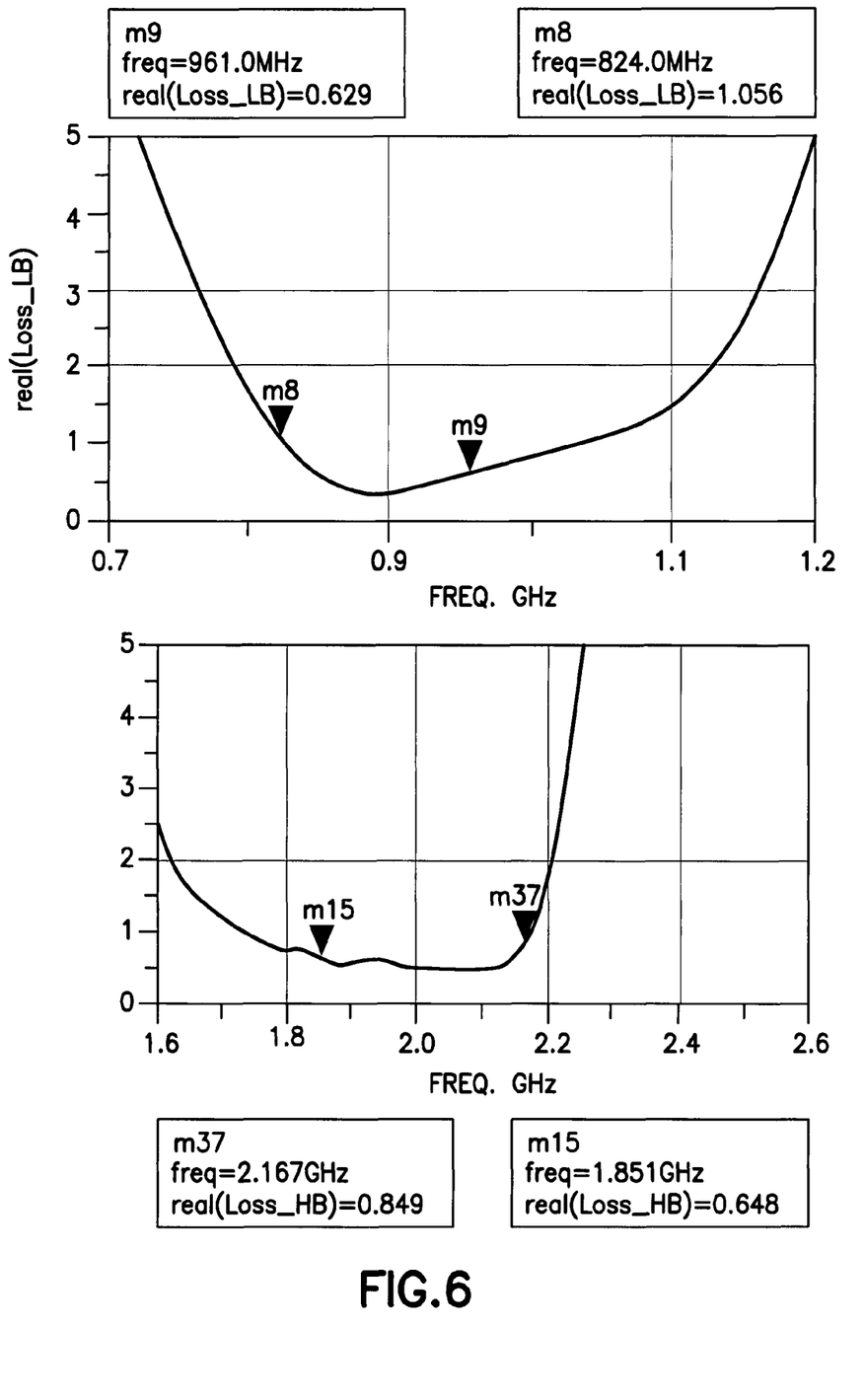
FIG. 6 depicts graphs descriptive of circuit loss seen at the HB and LB, where a 1 dB loss at 824 MHz is the greatest loss observed for the diplexer and antenna assembly.

FIG. 5 depicts graphs descriptive of derating for the SPDT SW shown in FIG. 1, specifically the current magnitude and the voltage magnitude (S). FIG. 6 depicts graphs descriptive of circuit loss seen at the LB and the HB, where a 1 dB loss at 824 MHz is the greatest loss observed for the diplexer and antenna assembly 10 shown in FIG. 1.

FIG. 7 shows a graph descriptive of losses in two frequency bands (GSM 1900, UMTS I, UMTS II, and UMTS I, UMTS II, UMTS IV and GSM 1800). The caption "tuned too high" indicates the point where the additional capacitance Cp is switched out (off).

Figure 8:
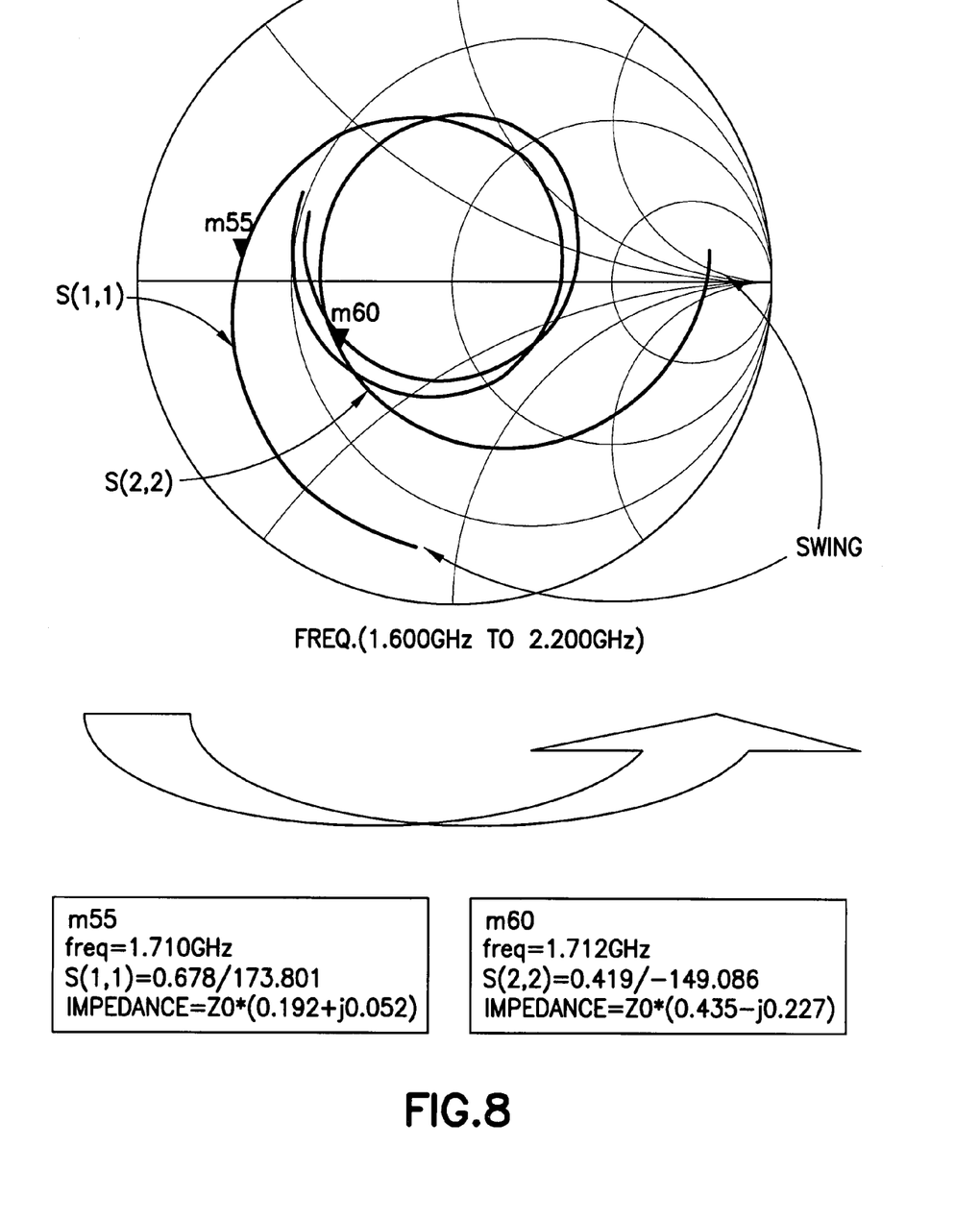
FIG. 8 is a Smith chart representation of a shift in frequency obtained by using the SPDT switch and capacitor shown in FIG. 1.

FIG. 8 is a Smith chart representation of a shift in frequency obtained by using the SPDT SW and Cp shown in FIG. 1. Note the significant shift in the HB curl that results from switching Cp in and out of the diplexer circuit. It should also be noted, and as was stated above, the SW and Cp can be replaced with a MEMS variable capacitance device where an electrical signal can be used to directly control the capacitance value.

Figure 9:
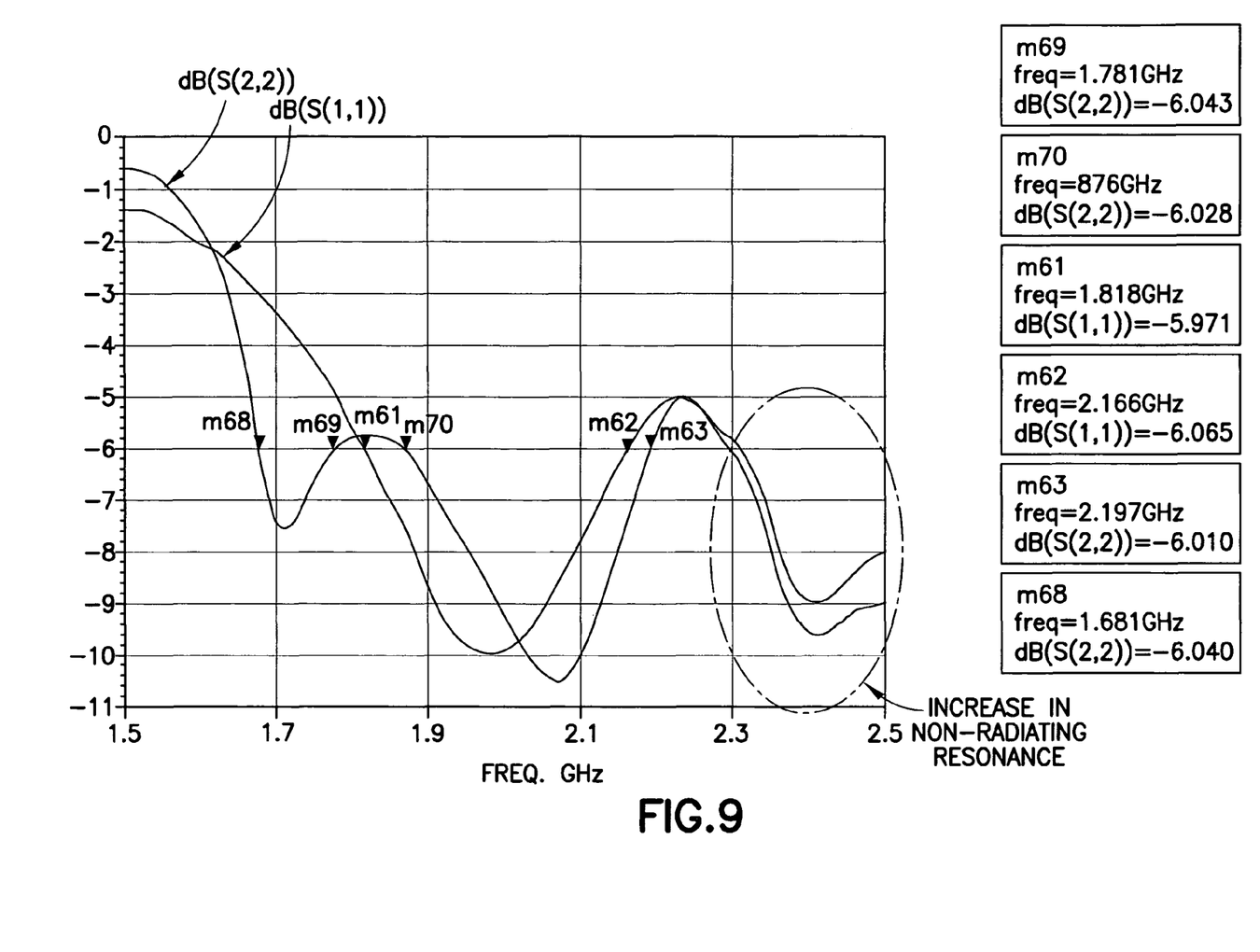
FIG. 9 is a graph showing HB S11 including SPDT switch s-parameter (right phase shift) and switch losses.

FIG. 9 is a graph showing HB S11 including SPDT switch s-parameter (right phase shift) and switch losses. It can be noted that small changes seen at HB when applying switch losses, indicating that antenna performance is not adversely affected by any SW losses. Note further that the increase in the non-radiating resonance bandwidth above about 2.3 GHz is not particularly significant since it is not near the operating bandwidth.

Figure 10:
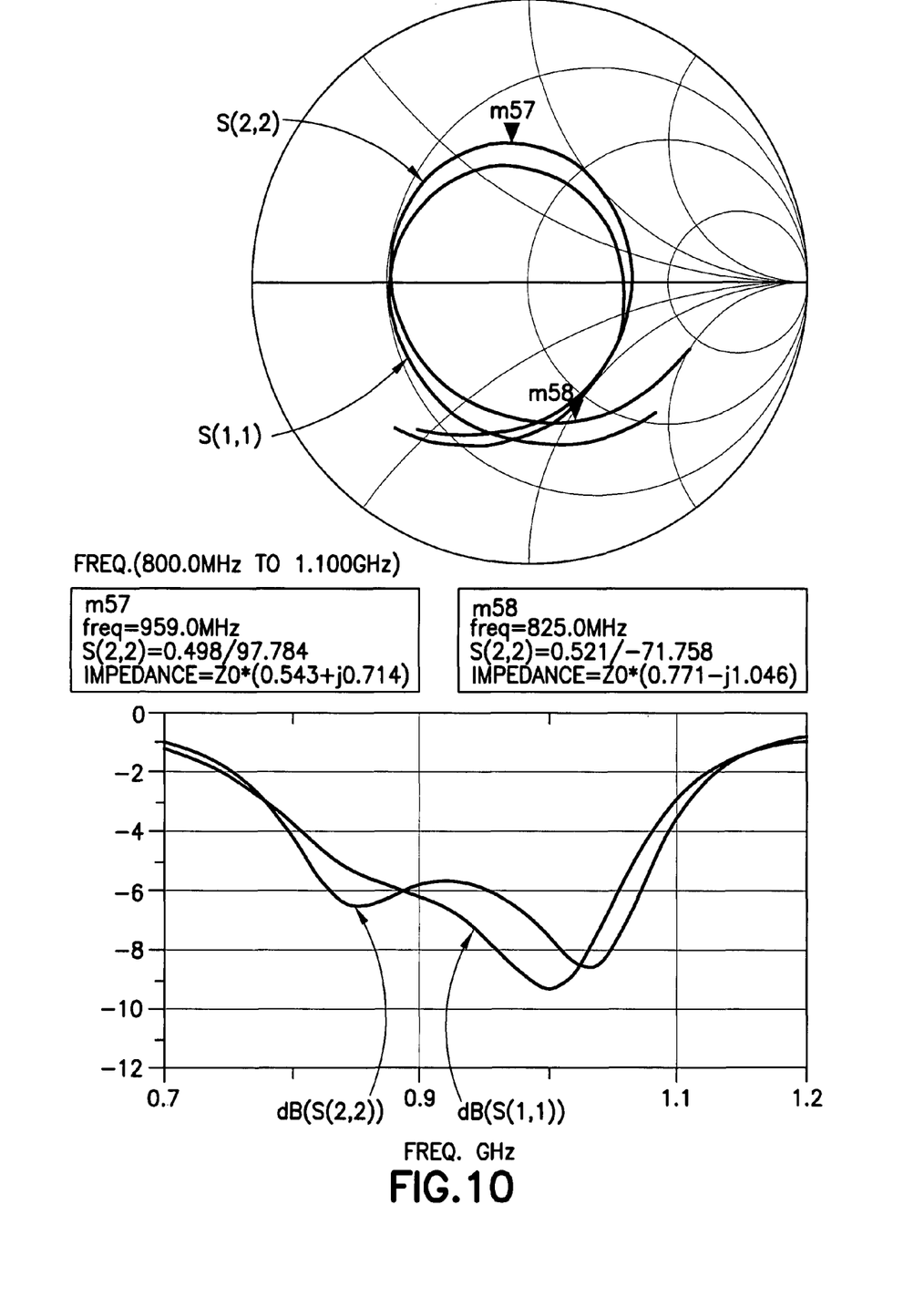
FIG. 10 shows a Smith chart presentation and a graph of LB impedance and S11, S22.

FIG. 10 shows a Smith chart presentation and a graph of LB impedance and S11, S22.

In operation, the baseband control unit 20, which may be embodied as a digital signal processor or some other type of data processor, applies the signal SW-Control to open and close the SW depending on the sub-band of current interest in the HB to selectively extend the usable frequency bandwidth of the antenna 12. That is, for one or more sub-bands in the HB the SW is closed, while for one or more other sub-bands in the HB it is opened.

More specifically, and referring again to FIG. 7, a first radio link state covers the following sub-bands in the high band: UMTS I, UMTS II, UMTS IV and GSM1800, where the SW is off (open), and the second state covers the following sub-bands in the high band: GSM1900, UMTSI, UMTSII, where the SW is on (closed).

It should be noted that at least some of the diplexer 16 components may be integrated within a single circuit package or module, either alone of in combination with other circuitry.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. As but some examples, the use of other component values, frequency bands and numbers of frequency bands may be attempted by those skilled in the art. However, all such and similar modifications of the teachings of this invention will still fall within the scope of the embodiments of this invention.

Further, the exemplary embodiments of this invention are not limited for use with two frequency bands, such as the LB and HB discussed herein, but may be applied as well for use with three or more bands of frequencies.

Furthermore, some of the features of the preferred embodiments of this invention may be used to advantage without the corresponding use of other features. As such, the foregoing description should be considered as merely illustrative of the principles, teachings and embodiments of this invention, and not in limitation thereof.

What is claimed is:

1. A circuit arrangement, comprising a diplexer having a single radio frequency input/output interface and dual feed connections with an antenna adapted for use over a plurality of frequency bands, said diplexer comprising a capacitance connected between said radio frequency input/output interface and the antenna, and further comprising an additional capacitance that is selectively one of connected or not connected in parallel with the capacitance.

2. The circuit arrangement as in claim 1, where said additional capacitance is comprised of a capacitor connected in series with a switch that is controlled through an electrical signal line.

3. The circuit arrangement as in claim 1, where said additional capacitance is comprised of a MEMS variable capacitor that is controlled through an electrical signal line.

4. The circuit arrangement as in claim 1, where said single radio frequency input/output interface is comprised of a 50 Ohm interface.

5. The circuit arrangement as in claim 1, operable over a range of frequencies from about 820 MHz to about 2100 MHz.

6. The circuit arrangement as in claim 1, embodied in a portable electronic device.

7. The circuit arrangement as in claim 1, embodied in a communication device.

8. An antenna arrangement comprising an antenna and a diplexer circuit, where the antenna comprises dual RF feeds fed from the diplexer circuit, and where the diplexer circuit generates at least two discrete resonant frequencies of the antenna arrangement in a first state, and where the diplexer circuit is controlled to generate at least two additional discrete resonant frequencies of the antenna arrangement in a second state, where said diplexer comprises a single radio frequency input/output interface.

9. The antenna arrangement as in claim 8, where said single radio frequency input/output interface is comprised of a 50 Ohm interface.

10. The antenna arrangement as in claim 8, where said diplexer circuit comprises a capacitance connected in series with a switch that is controlled through an electrical signal line, said capacitance being placed in parallel with another diplexer capacitance when said switch is closed.

11. The antenna arrangement as in claim 8, where said diplexer circuit comprises a MEMS variable capacitance controlled through an electrical signal line, said MEMS variable capacitance connected in parallel with another diplexer capacitance.

12. The antenna arrangement as in claim 8, operable over a range of frequencies from about 820 MHz to about 2100 MHz.

13. The antenna arrangement as in claim 8, embodied in a portable electronic device.

14. The antenna arrangement as in claim 8, embodied in a communication device.

15. The antenna arrangement as in claim 8, where said diplexer circuit comprises a single radio frequency input/output interface and dual feed connections coupled to said dual RF feeds, with said antenna adapted for use over a plurality of frequency bands, said diplexer circuit comprising a capacitance connected between said radio frequency input/output interface and said antenna, and further comprising an additional capacitance that is selectively one of connected or not connected in parallel with the capacitance.

16. A method, comprising:
   providing a diplexer having a single radio frequency input/output interface and dual feed connections with an antenna adapted for use over a plurality of frequency bands within a bandwidth; and
   applying a signal to the diplexer to change a value of a capacitance for shifting antenna resonances to operate over a wider bandwidth.

17. The method of claim 16, where applying the signal closes a switch to connect a first capacitance in parallel with a second capacitance.

18. The method of claim 16, where applying the signal causes a MEMS variable capacitance to change value.

19. The method as in claim 16, where the antenna is operable over a range of frequencies from about 820 MHz to about 2100 MHz.

20. The method as in claim 16, executed in a portable electronic device.

21. The method as in claim 16, executed in a communication device.

22. The method of claim 16, where the signal is applied selectively when operating in a high frequency band to increase a value of a diplexer capacitance in at least one frequency sub-band.

23. Apparatus comprising:
   radio frequency antenna coupling means comprised of a single radio frequency input/output interface and dual feed connections with an antenna that is adapted for use over a plurality of frequency bands, said radio frequency antenna coupling means further comprising a first capacitance connected between said radio frequency input/output interface and the antenna, and further comprising means for selectively increasing or not increasing a value of the first capacitance.

24. The apparatus as in claim 23, where said means for selectively increasing or not increasing the value of the first capacitance is comprised of a switch in series with a second capacitance for connecting the second capacitance in parallel with the first capacitance when the switch is closed, said switch controlled through an electrical signal line.

25. The apparatus as in claim 23, where said means for selectively increasing or not increasing the value of the first capacitance is comprised of an electrically controllable variable capacitance.

26. The apparatus as in claim 23, where said single radio frequency input/output interface is comprised of a 50 Ohm interface.

27. The apparatus as in claim 23, operable over a range of frequencies from about 820 MHz to about 2100 MHz.

28. The apparatus as in claim 23, embodied in a portable electronic device.

29. The apparatus as in claim 23, embodied in a communication device.

* * * * *